United States Patent [19]
Koch et al.

[11] 4,433,951
[45] Feb. 28, 1984

[54] MODULAR LOADLOCK

[75] Inventors: George R. Koch, Los Altos; Carl T. Petersen, III, Fremont, both of Calif.

[73] Assignee: Lam Research Corporation, Fremont, Calif.

[21] Appl. No.: 234,307

[22] Filed: Feb. 13, 1981

[51] Int. Cl.³ .............................................. C23C 13/08
[52] U.S. Cl. ....................................... 414/217; 49/68; 49/254; 220/331; 414/222; 414/744 R
[58] Field of Search ............... 414/217, 222, 225, 226, 414/744 R, 744 A, 744 B, 744 C; 49/68, 254; 220/331

[56] References Cited

U.S. PATENT DOCUMENTS

Re. 25,889 10/1965 Willsea ........................... 414/744 A
3,656,454 4/1972 Schrader ......................... 414/217 X
3,874,525 4/1975 Hassan et al. ....................... 414/225

Primary Examiner—Robert G. Sheridan
Attorney, Agent, or Firm—Thomas E. Schatzel

[57] ABSTRACT

A loadlock apparatus for a workpiece processing chamber such as those incorporated in vacuum processing systems. The apparatus includes an isolation chamber having evacuation apertures and workpiece transfer apertures with independently operable doors for closing and sealing the workpiece transfer apertures and an independent operable workpiece transfer mechanism. The doors and workpiece transfer mechanisms may be contained within the isolation chamber and the chamber may be closed and sealed while containing a workpiece. The door and workpiece transfer mechanisms may be adapted such that they are not positioned over the workpiece, thereby reducing the possibility of workpiece particulate contamination.

The preferred embodiment of the workpiece transfer mechanism moves a workpiece through the isolation chamber along a path which is essentially a straight line. An alternative embodiment of this transfer mechanism permits positioning the workpiece at any point lying on or within a circular radius of a fixed point within the isolation chamber. This alternative embodiment can further move the workpiece to any such point along an arbitrarily chosen planar path lying within this positioning circle.

10 Claims, 8 Drawing Figures

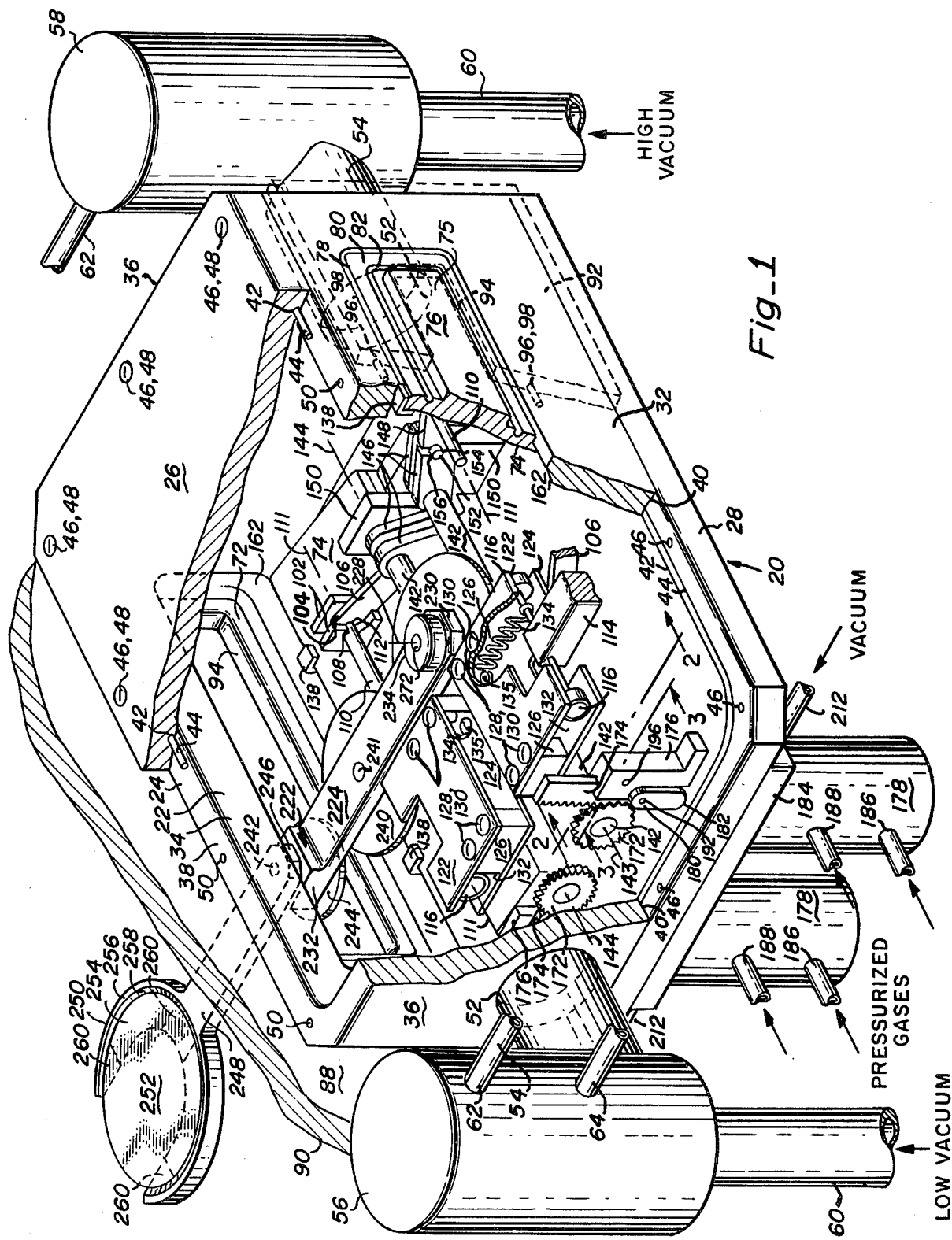
Fig_1

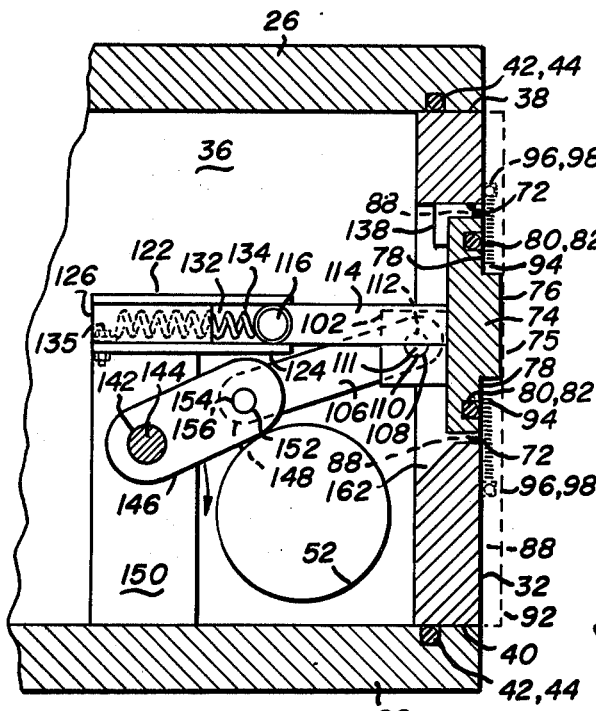
Fig_2A
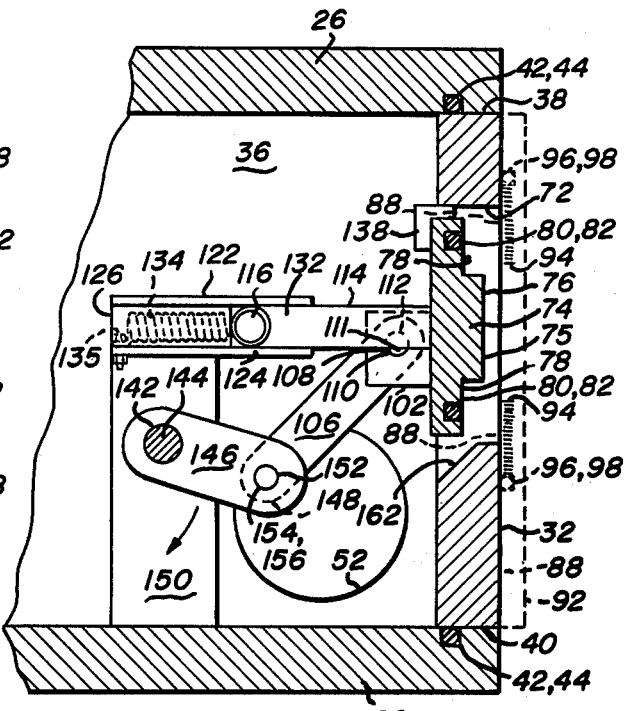
Fig.2B
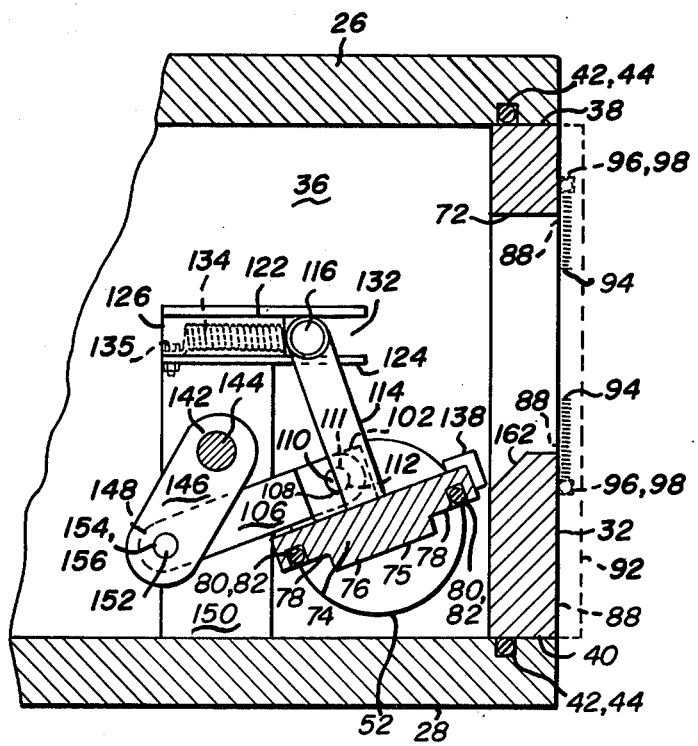
Fig_2C

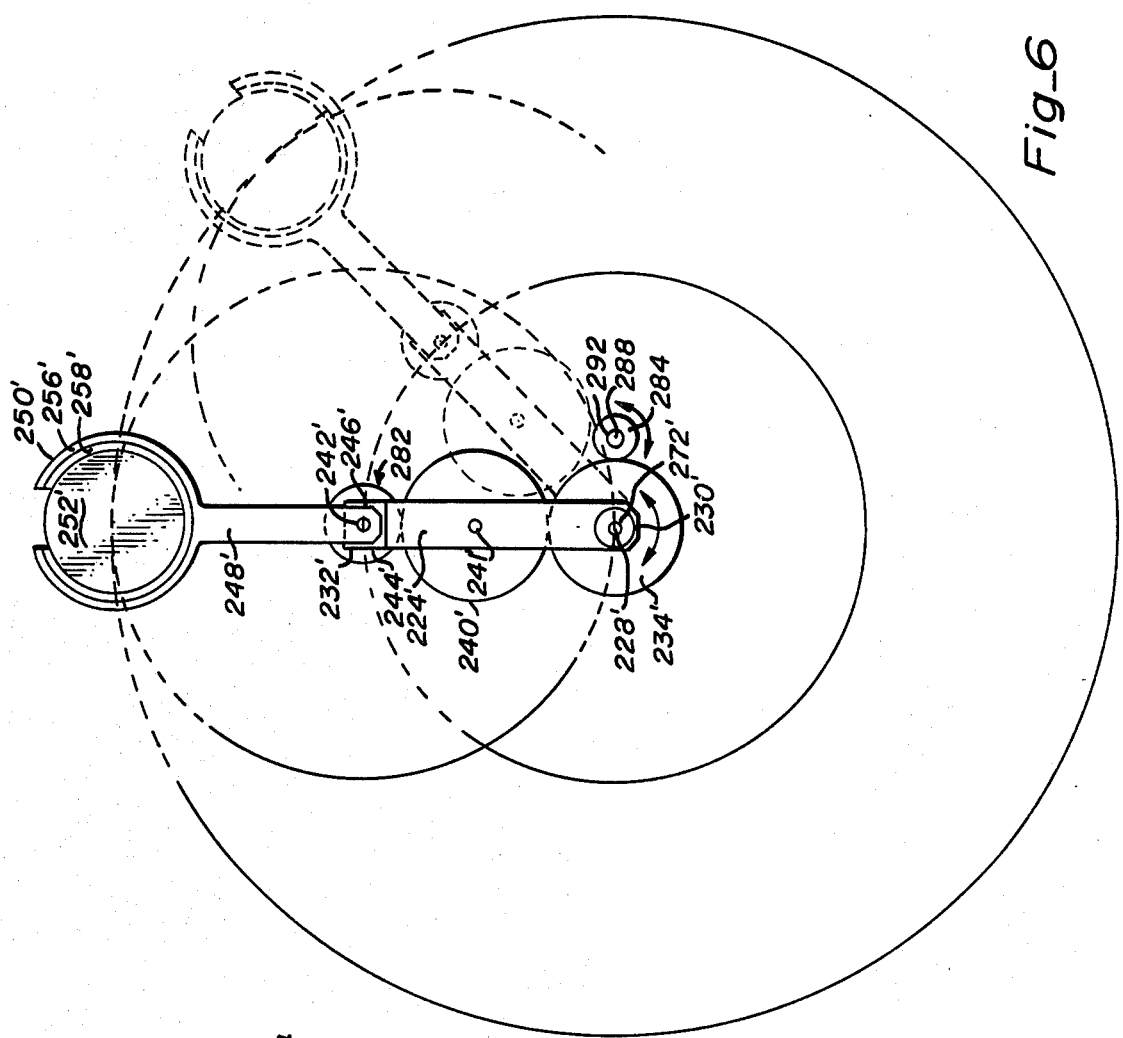
Fig_6
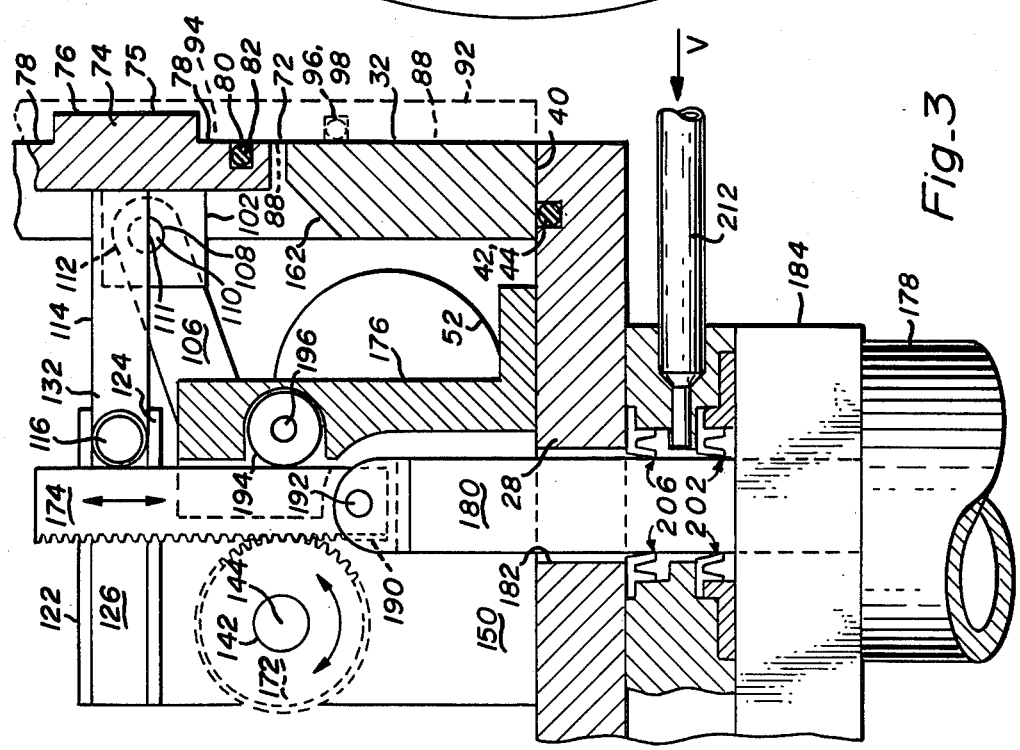
Fig_3

MODULAR LOADLOCK

BACKGROUND OF THE INVENTION

1. Field of the Invention

This invention relates generally to material handling equipment and more particularly to devices for transferring workpieces into and out of sealable chambers of processing equipment.

2. Description of the Prior Art

The concept and utility of loadlocks, although often referred to by other names such as airlocks, have been recognized for many years. Loadlocks are routinely employed in a wide variety of endeavors whenever an object is to be transferred from an environment within one chamber to a different environment outside that chamber and interaction between the two environments is to be minimized or prevented. An essential structural feature of a loadlock is that it includes a chamber intermediate the two environments to be isolated and means for opening and then closing that chamber first to the space having one environment and then to the space having the other environment. In many applications, the intermediate chamber is brought into pressure and environmental equality with the adjoining space before being opened thereto. A familiar example of such an apparatus is the torpedo tube of submarine. This device permits a projectile, originally located within the substantially dry and air-filled environment within a vessel, to enter the liquid environment surrounding the hull while minimizing the entry of water into the submarine's interior. Similarly, the airlock of a space vehicle allows its occupants to leave the pressurized environment of its cabin and enter into the vacuum environment of space without exposing the whole interior of the spacecraft to that vacuum environment.

Because of their usefulness, loadlocks are routinely employed in manufacturing equipment to transfer a workpiece into or out of processing chambers while minimizing the entry of other material thereinto or its escape therefrom. In particular, loadlocks are conventionally incorporated into vacuum processing equipment of the type used in the semiconductor fabrication industry. The use of such vacuum processing equipment in this industry is increasing because the processes of sputtering, plasma etching, and reactive ion etching are currently being adopted as replacements for wet chemical processing. The use of loadlocks in these processing systems may be absolutely mandatory in some cases because opening a reaction chamber permits gasses to be adsorbed from the air onto its interior surfaces. Frequently, processing performed in a chamber after it has been exposed to air produce results differing greatly from those obtained prior to such exposure. These changes in performance may often be traced to adsorbed gasses or, in particular, moisture on the chamber wall which have not been removed by subsequent evacuations. Particularly with plasma or reactive ion etching, opening a chamber can greatly affect its performance because the presence of such adsorbed gasses can alter the chemical reactions occurring within it.

Another significant advantage generally obtained by using a loadlock to transfer a workpiece into an evacuated processing chamber is reduced vacuum pump load. Vacuum pump load is reduced because the loadlock usually encloses a much smaller volume than that of the processing chamber. Thus, using a loadlock reduces the volume of gasses to be pumped from the system for each work piece processed in comparison with a corresponding system not employing a loadlock. This reduced pumping load either allows the workpiece to be exposed to a vacuum environment more quickly or permits a reduction in the capacity of the pump employed to establish the vacuum, or a combination of both faster evacuation and reduced pump size.

While the loadlocks currently employed in semiconductor industry processing equipment have common features, e.g. they are generally adapted to handle disk-shaped workpieces having a thickness in the range of 0.010 to 0.050 inches and diameters measured in inches, thus far most manufacturers of vacuum processing equipment have integrated the components of the loadlock into the total structure of the processing system. The absence of a standardized modular apparatus to perform this common function creates several difficulties. First, since the workpiece to be transferred through such a loadlock is fragile and easily contaminated, each manufacturer must expend a significant effort in developing a workable apparatus and making its operation reliable. Furthermore, the magnitude of this development effort is increasing because the trend is to operate vacuum processing systems under computer control with all wafer handling performed automatically without human intervention. A second difficulty is the maintenance and repair of processing equipment in a factory equipped with a variety of systems each having a unique loadlock structure. Such a mixture of equipment requires that those responsible for its maintenance be familiar with the structure and operation of each individual mechanism. Furthermore, such a mixture of equipment may require the maintenance of an inventory of spare parts for each type of loadlock. Thus, it is evident that identifiable benefits could accrue to both those building and those using vacuum processing systems if a standardized, modular loadlock were employed.

SUMMARY OF THE PRESENT INVENTION

An object of the present invention is to provide an improved integral loadlock device.

Another object of the present invention is to provide a loadlock capable of being easily interfaced to a chamber from which it may receive or into which it may deliver a workpiece.

Another object of the present invention is to provide a loadlock capable of transferring a workpiece from a first processing chamber to a second processing chamber.

Another object of the present invention is to provide a loadlock capable of reducing the possibility of workpiece contamination.

Another object of the present invention is to provide a loadlock having an isolation chamber which may be closed and sealed while containing a workpiece transfer mechanism.

Another object of the present invention is to provide a loadlock incorporating a workpiece transfer mechanism capable of moving the center of a workpiece along a substantially linear path from outside an isolation chamber, inward through an open aperture formed in a wall thereof, through the interior of the isolation chamber and thence outward through a second open aperture formed in a wall thereof.

A further object of the present invention is to provide a loadlock incorporating a workpiece transfer mechanism capable of moving the center of a workpiece from outside an isolation chamber, inward through an open aperture formed in a wall thereof, through the interior of the isolation chamber and thence outward through a second aperture formed in a wall thereof, the center of the workpiece being movable from and to any point lying on or within a positioning circle centered about a fixed point located within the isolation chamber along an arbitrarily chosen planar path lying within that positioning circle.

Briefly, a preferred embodiment of the loadlock of the present invention includes a sealable isolation chamber having two evacuation apertures and two workpiece transfer apertures. The workpiece transfer apertures are formed symmetrically through opposite planar parallel side walls of the isolation chamber. The outer surface of these side walls are adapted to be sealed to a corresponding planar surface of a processing chamber wall through which a workpiece may be delivered or retrieved.

The loadlock of this invention also includes two doors for closing and sealing the workpiece transfer apertures. These doors, which are independently operable from outside the isolation chamber, are substantially planar plates which, when positioned to close and seal the isolation chamber, are aligned parallel to the planar side walls thereof. These doors are further adapted to seal the isolation chamber by a U-shaped trough formed near the periphery of their outer surface in which an O-ring is retained. Because these doors are constructed to be smaller than the workpiece transfer apertures, they close these apertures by entering into them. Disposed in this position, these doors may form a seal by pressing the O-ring which they retain outward against the planar wall of the processing chamber to which the loadlock is secured and sealed. Thus, the aperture formed in this wall of the processing chamber should be shaped similar to and no larger than the corresponding U-shaped trough in the door. Both the workpiece transfer aperture in the isolation chamber wall and the corresponding aperture in the processing chamber wall are opened to permit passage of a workpiece therethrough by first retracting the door inward from the processing chamber wall and then swinging it downward within the isolation chamber to a position beneath the lower edge of the workpiece transfer aperture.

The loadlock of this invention further includes a workpiece transfer mechanism, operable from outside the isolation chambers, which may be positioned so as to be contained within the closed and sealed isolation chamber. The workpiece transfer mechanism includes a support arm secured at one of its terminal ends within the isolation chamber so as to be rotatable in a plane passing through both the workpiece transfer apertures. A central spur gear is disposed adjacent to and beneath the support arm so as to have its pitch circle both parallel to the plane in which the support arm is rotatable and concentric with the axis of rotation of that arm. An idler spur gear, disposed essentially coplanar with and meshing with the central gear, is rotatably secured beneath the support arm intermediate its terminal ends. A rod-shaped workpiece arm shaft passes through the support arm near its terminal end farthest from the central gear. This shaft is secured to the support arm so as to be rotatable about its longitudinal axis disposed perpendicular to the plane in which the support arm is rotatable. Secured about a first terminal end of this shaft beneath the support arm is a drive spur gear disposed essentially coplanar with and meshing with the idler gear. Above the upper surface of the support arm, a first terminal end of a workpiece arm is rigidly secured about a second terminal end of the workpiece arm shaft. A second terminal end of this arm, adapted to retain a disk-shaped workpiece such as a silicon wafer, is formed to have a planar, U-shaped supporting wall above the circumference of which projects a circular, horseshoe-shaped rim. The workpiece transfer apertures are formed in the isolation chamber walls, and these arms and gears are positioned so that the workpiece arm, the terminal end of the support arm farthest from the central gear and the workpiece arm drive gear may be sequentially extended first through one open workpiece transfer aperture and then through the other open workpiece transfer aperture. The workpiece transfer mechanism of this invention is capable of two distinctly different modes of operation. A first mode of operation is one in which the support arm rotates while the central gear is held fixed. A second, alternative mode of operation employs rotation of both the support arm and the central gear to impart motion to the workpiece. In the first mode of operation, as the support arm rotates, the center of the workpiece moves along a planar path determined by the relative ratios of the central and drive gears and by the distance between the center of the workpiece and the axis of rotation of the workpiece arm shaft. In the preferred embodiment of this invention, the ratio of these two gears and this distance are selected to provide essentially linear motion of the workpiece's center from outside one side wall of the isolation chamber, through the interior of the chamber to outside the opposite side wall. The alternative mode of operation for this wafer transfer mechanism permits the center of the workpiece to be moved to any point lying on or within a positioning circle centered about and perpendicular to the axis of rotation of the support arm. The radius of this positioning circle is equal to the sum of the distances between the axis of rotation of the support arm and the axis of rotation of the workpiece arm shaft and between the axis of rotation of the workpiece arm shaft and the center of the workpiece. Furthermore, in this second mode of operation, the center of the workpiece may be moved between any two points within that positioning circle along an arbitrarily chosen planar path lying within it.

An advantage of the loadlock of the present invention is that it is a modular, integral device containing all the mechanisms necessary to function as such.

Another advantage of the loadlock of the present invention is that it is capable of being easily interfaced to processing chambers.

Another advantage of the loadlock of the present invention is that it may be employed to remove a workpiece from a first processing chamber and deliver it to a second processing chamber.

Another advantage of the loadlock of the present invention is that it reduces the possibility of workpiece contamination.

Another advantage of the loadlock of the present invention is that it may be sealed while containing the workpiece transfer mechanism.

Another advantage is that the loadlock of the present invention may be constructed to incorporate a workpiece transfer mechanism by which the center of a workpiece may be moved along a linear path.

A further advantage is that the loadlock of the present invention may be constructed to incorporate a workpiece transfer mechanism by which the center of a workpiece may be moved between any two points lying on or within a positioning circle centered about a fixed point along an arbitrarily chosen planar path lying within that positioning circle.

These and other objects and advantages of the present invention will no doubt become obvious to those of ordinary skill in the art after having read the following detailed description of the preferred embodiments as illustrated in the various drawing figures.

IN THE DRAWING

FIG. 1 is a partially sectioned perspective view of a loadlock in accordance with the present invention;

FIG. 2a is a cross-sectional view of a door of the loadlock closed and sealed to a wall of a processing chamber taken along the line 2—2 of FIG. 1;

FIG. 2b is a cross-sectional view of a door of the loadlock retracted inward from a wall of a processing chamber taken along the line 2—2 of FIG. 1;

FIG. 2c is a cross-sectional view of a door rotated downward within the interior of the loadlock taken along the line 2—2 of FIG. 1;

FIG. 3 is a cross-sectional view of a door actuator mechanism of the loadlock taken along the line 3—3 of FIG. 1;

FIG. 6 is a plan view taken along the line 6—6 of FIG. 5 showing the characteristics of arbitrary planar workpiece motion.

DETAILED DESCRIPTION OF THE PREFERRED EMBODIMENT

Figure 4:
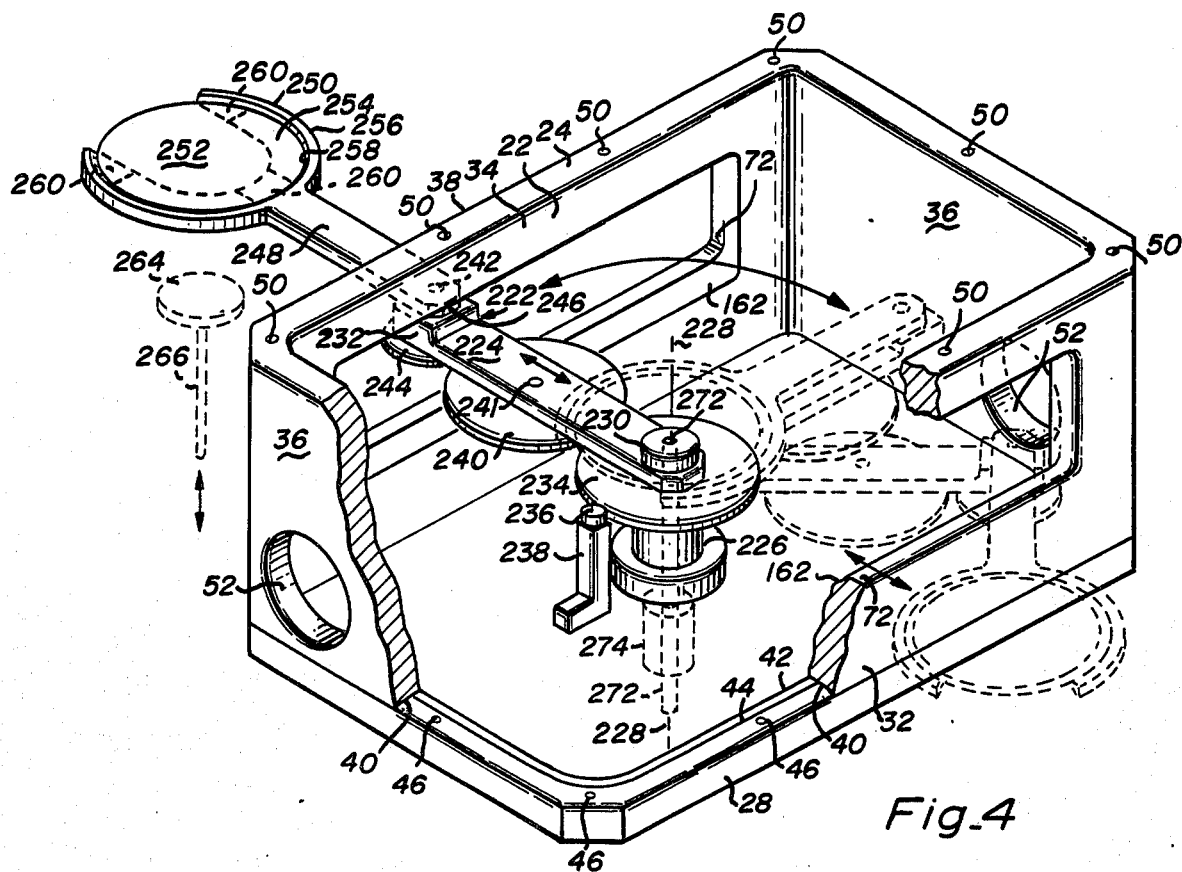
FIG. 4 is a partially sectioned perspective view of the loadlock of FIG. 1 showing linear motion of the workpiece center.

FIG. 1 shows a loadlock, referred to by the general reference number 20, in accordance with the present invention. The loadlock 20 includes a sealable isolation chamber 22 assembled from a unitary, box cross-sectional shaped body 24, a planar top wall 26, and a planar bottom wall 28. The body 24 has a planar first side wall 32, a planar second side wall 34, and two planar end walls 36. The side walls 32 and 34 are spaced apart from each other and aligned substantially parallel to one another. The end walls 36 are also spaced apart from each other and are aligned perpendicular to the side walls 32 and 34. The body 24 has a planar upper sealing surface 38 and a planar lower sealing surface 40 formed on opposite edges of the side walls 32 and 34 and the end walls 36. The sealing surfaces 38 and 40 are aligned perpendicular to the side walls 32 and 34 and the end walls 36.

The top wall 26 and the bottom wall 28 are positioned immediately adjacent to the sealing surfaces 38 and 40, respectively. The edges of the top wall 26 and the bottom wall 28 are shaped so as to conform to the outer side surfaces of the body 24 immediately adjacent thereto. A continuous U-shaped trough 42 is formed in the lower surface of the top wall 26 and the upper surface of the bottom wall 28 near the periphery thereof. The troughs 42 are located outside of the inner side surfaces of the body 24 so that they may respectively receive and retain O-rings 44 in a sealing relationship with the sealing surfaces 38 and 40. Also formed perpendicularly through the top wall 26 and the bottom wall 28 are a plurality of holes 46 adapted to permit an equal plurality of fasteners 48 to respectively pass therethrough. The holes 46 are located outward from the U-shaped trough 42 so that their presence does not affect sealing of the isolation chamber 22. A plurality of threaded apertures 50, equal in number to the plurality of holes 46, are respectively formed through the sealing surfaces 38 and 40 and into the body 24 so as to be aligned with the holes 46 and to receive and engage the fasteners 48.

The end walls 36 have circular apertures 52 formed therethrough and positioned near the lower sealing surface 40 for conducting fluids into or out of the isolation chamber 22. Secured respectively to the apertures 52 are inlet ports 54 of pneumatically operated vacuum valves 56 and 58. Vacuum, applied to the outlet ports 60 of the valves 56 and 58, is conducted to the chamber 22 to remove gasses therefrom in response to flows of pressurized gasses supplied to a pair of control ports 62 an 64. These flows may be applied to the control ports 62 and 64 so as to first expose the interior of the chamber 22 to a low vacuum through the valve 56 and then subsequently expose it to a high vacuum through the valve 58.

The side walls 32 and 34 have respectively formed therethrough an elongated, rectangular-shaped workpiece transfer aperture 72 having its longitudinal axis aligned parallel to the sealing surfaces 38 and 40 and thus to the planar surfaces of the top wall 26 and bottom wall 28.

The loadlock 20 further incorporates a pair of planar doors 74 adapted to close the workpiece transfer apertures 72. Because the doors 74 are constructed to be smaller than the workpiece transfer apertures 72, the doors 74 when disposed to close and seal the loadlock 20 enter into the apertures 72. When disposed to seal the apertures 72, the outer side sealing surfaces 75 of the doors 74 are disposed respectively parallel to the side surfaces of the side walls 32 and 34. The outer side surfaces 75 have a rectangular raised central region 76 around which extends a planar flange 78. Formed in the surface of the flange 78 is a continuous U-shaped trough 80 adapted to receive an O-ring 82.

To render the workpiece transfer apertures 72 of the isolation chamber 22 sealable, the outer side surface of the side walls 32 or 34 are secured to a corresponding planar surface 88 of a processing chamber wall 90 or of a flat sealing plate 92 if the workpiece transfer aperture 72 is to open to the normal atmospheric environment. The planar surface 88 is adapted to receive the raised region 76 of the door 74 by means of an elongated rectangular-shaped aperture 94 formed through the wall 90 or the sealing plate 92. The junction of the inner surface of the aperture 94 with the planar surface 88 should be shaped similar to and no larger than the inner side surface of the U-shaped trough 80 closest to the raised region 76. A seal is established between the side walls 32 and 34 and the wall 90 or the sealing plate 92 by means of a U-shaped through 96 formed in the planar surface 88 to retain an O-ring 98. The inner side surface of the U-shaped trough 96 should be shaped and positioned on the surface 88 so as to lie outside the junction of the surface of the workpiece transfer aperture 72 with the outer side surface of the side walls 32 or 34. With the loadlock thus secured to the wall 90 or the sealing plate 92, the workpiece transfer aperture 72 may be sealed by disposing the door 74 therethrough and pressing the surface of the O-ring 82 against the planar surface 88.

This structure for sealing the workpiece transfer aperture 72 has been adopted in order to reduce the space occupied by the loadlock 20.

Projecting from the inner surface of each door 74 opposite to the sealing surface 75 and positioned symmetrically about the longitudinal midpoint of each door 74 are two pair of door closure lugs 102. The side surfaces of the lugs 102 are aligned perpendicular to the longitudinal axis of the door 74 with the lugs 102 of each pair being separated from one another so as to receive a first terminal end 104 of a connecting link 106. Each lug 102 has formed therethrough a circular hole 108 adapted to receive a rod-shaped door closure pin 110. The door closure pin 110, which has its central cylindrical axis 111 disposed parallel to the longitudinal axis of the door 74 and to the plane of the flange 78, extends between the outermost side surfaces of the door closure lugs 102. Formed through the first terminal end 104 of the connecting links 106 is a hole 112 through which the door closure pin 110 passes.

Also projecting from the same surface of the door 74 as the door closure lugs 102 and positioned toward one longitudinal end of the door 74 from the door closure lugs 102 is a rectangularly shaped control link 114. Secured on opposite lateral sides near the end of the control link 114 farthest from the sealing surface is a pair of rollers 116. The rollers 116 are secured so as to be rotatable about axes parallel to the longitudinal axis 111 of the door closure pin 110.

Located immediately above the rollers 116 is a U-shaped upper guide plate 122, and immediately beneath the rollers 116 is a U-shaped lower guide plate 124. A spacer block 126, having a thickness slightly greater than the diameter of the rollers 116 is positioned between the guide plates 122 and 124 near their corners farthest from the door 74. A plurality of aligned holes 128 are formed through the plates 122 and 124 and the block 126 to receive an equal plurality of fasteners 130. The plates 122 and 124 and the block 126 are formed into a guide track 132 by securing them together with fasteners 130 and then securing that assembly to the bottom wall 28 of the chamber 22. The guide track 132, thus established, is positioned so as to constrain the rollers 116 and the door 74 to translate only in a plane perpendicular to the planar outer surfaces of the side walls 32 and 34. Contained within the guide track 132, near its edge farthest from the side walls 32 and 34, is a coil spring 134 which urges the door 74 to retract inward toward the middle of the chamber 22. One terminal end of the spring 134 is secured by means of a threaded fastener 135 to the lower guide plate 124, while a second terminal end hooks around the shaft of the rollers 116.

Each door 74 has respectively secured thereto two L-shaped slide members 138 formed from a glass filled Teflon material. One leg of each L-shaped slide member 138 abuts the surface of the door 74 from which project the lugs 102 and the control link 114 while the other leg abuts the upper edge surface of the flange 78 closest to the top wall 26. The slide members 138 are shaped and are respectively positioned toward the longitudinal ends of the door 74 symmetrically about the longitudinal midpoint thereof so that it is properly positioned vertically within the workpiece transfer aperture 72 when the members 138 are in contact with the upper surface thereof. The leg of the L-shaped slide members 138 abutting the upper edge surface of the flange 78 does not extend its full width so they do not interfere with closure and sealing of the door 74.

A rod-shaped rotary drive shaft 142, having a central longitudinal axis 144, is located intermediate the guide track 132 and the upper surface of the bottom wall 28 beneath the coil spring 134. The drive shaft 142 is positioned so that the axis 144 thereof is parallel to the longitudinal axis 111. Two pair of drive links 146, projecting radially outward from the drive shaft 142, are rigidly secured along its length so as to align respectively with the pairs of door closure lugs 102. Thus, each pair of drive links 146 is respectively adapted to receive a second terminal end 148 of the connecting links 106. The drive shaft 142 is secured in this position so as to be rotatable about the axis 144 by means of two lugs 150 located respectively outward along its length from the outermost drive links 146. Similar to the door closure lugs 102, each drive link 146 has a circular hole 152 formed therethrough near its terminal end farthest from the drive shaft 142. The holes 152 of each pair of links 146 are formed so as to respectively receive a drive pin 154 having its longitudinal axis aligned parallel to the longitudinal axis 111 of the door closure pin 110. Similar to the first terminal end 104 of the connecting link 106, the second terminal end 150 of each connecting link 106, has a circular hole 156 formed therethrough through which the drive pins 154 respectively pass.

The foregoing elements act together to open the closed and sealed door 74, shown in FIG. 2A through 2C, as follows. With the door 74 closed and sealed, the rotary drive shaft 142 is positioned so that the centers of the drive pins 154 lie slightly above the plane established by the parallel axes 111 and 144. With the rotary drive shaft 142 disposed in this position, the slide members 138 are urged into contact with the upper surface of the workpiece transfer aperture 72 and the coil spring 134 is stretched outward from the edge of the guide track 132 farthest from the side wall 32. In this extended position, the spring 134 applies a force to the control link 114 urging the door 74 to translate horizontally inward into the isolation chamber 22 away from the planar surface 88. Thus, the seal between the O-ring 82 and the planar surface 88 may be broken by turning the drive shaft 142 so that the drive links 146 rotate downward toward the bottom wall 28. This rotary motion, coupled to the door 74 by means of the connecting links 106 and the pins 110 and 154, permits the coil spring 134 to translate the door 74 horizontally parallel to the guide track 132 until the rollers 116 contact the spacer blocks 126. After contact is made with the spacer blocks 126, continued rotation of the drive shaft 142 causes the control link 114 to pivot downward about the axis of rotation of the roller 116, thereby guiding the door 74 downward to its open position near the bottom wall 28. A bevelled edge 162 is formed at the junction of the workpiece transfer aperture 72 with the inner surface of the side wall 32 to permit a further reduction of the space occupied by the loadlock 20 by providing clearance between the wall 32 and the raised region 76 of the door 74 during the pivoting motion thereof.

The door 74, when disposed in its open position, is caused to close and seal the workpiece transfer aperture 72 by rotating the drive shaft 142 in a direction opposite to that employed to open it. During the initial rotation of the drive shaft 142, the coil spring 134 retains the roller 116 in contact with the spacer block 126. Thus, the door 74 first rotates upward about the axis of rotation of the roller 116 until the slide member 138 contacts the upper surface of the workpiece transfer aperture 72. Contact between the slide member 138 and the upper surface of the aperture 72 positions the door 74 for translation thereinto. Prevented from pivoting further about the axis of a rotation of the roller 116, the door 74 is thus constrained to translate laterally into the workpiece transfer aperture 72 in response to further rotation of the drive shaft 142. At the limit of travel of the rotary drive shaft 142 in this direction, when the central cylindrical axis of the pins 154 lie above the plane established by the parallel axes 111 and 144, the raised region 76 enters into the aperture 92 and the O-ring 82 presses against the planar surface 88.

In the preferred embodiment of this invention, rotary motion of the shaft 142 is induced by means of a spur gear 172 secured to one terminal end of the shaft 142, as shown in FIG. 1. The gear 172 is engaged by a rack 174 which is supported in that position by a guide 176 secured to the bottom wall 28. Linear motion of the rack 174 is induced by means of pneumatic cylinder 178 located beneath the bottom wall 28. The pneumatic cylinder 178 is connected to the rack 74 by means of connecting rod 180 which passes through an aperture 182 in the wall 28. The pneumatic cyclinders 178, secured to the bottom wall 28 by means of a mounting block 184, are energized by means of pressurized gasses supplied to them through a first inlet port 186 or a second inlet port 188. As shown in FIG. 3, the connecting rod 180 has a U-shaped trough 190, adapted to receive a terminal end of the rack 174, formed across its terminal end nearest to the spur gear 172. The connecting rod 180 and the rack 174 are connected by means of a pin 192 passing through their adjacent terminal ends. Also shown in FIG. 3, the guide 176 contains a ball bearing 194 secured to it by a pin 196 passing through the side walls of the guide 176 and the center of the bearing 194. The outer cylindrical surface of the ball bearing 194 contacts the side surface of the rack 174 farthest from the spur gear 172 so as to reduce frictional engagement between the rack 174 and the guide 176.

Leakage of ambient gasses along the connecting rod 180 into the chamber 22 is reduced by means of a first seal 202 located near the end of the pneumatic cylinder 178 closest to the bottom wall 28 and a second seal 206 which surrounds the connecting rod 180 near its entrance into the aperture 182 at the bottom wall 28. The upper surface of the seal 202 and the bottom surface or the seal 206 establish a circular chamber 210 surrounding the connecting rod 180. Vacuum is applied to the chamber 210 through a vacuum port 212 in order to remove gases seeping past the first seal 202 before they can leak past the second seal 206 into the chamber 22.

The preferred embodiment of the loadlock 20 of this invention also includes a workpiece transfer mechanism referred to by the general reference number 222, as shown in FIG. 4. The workpiece transfer mechanism 222 includes a support arm 224 secured to the bottom wall 28 by means of a pedestal 226. The support arm 224 is rotatable about an axis 228 passing through it near a first terminal end 230. The axis 228 is aligned perpendicular to the bottom wall 28 and is thus also perpendicular to the longitudinal axis of the workpiece transfer aperture 72. The axis 228 is positioned equidistant between the side walls 32 and 34 and the support arm 224 is constructed and positioned along the axis 228 so that a second terminal end 232 thereof may pass through the open workpiece transfer apertures 72 upon rotation of the support arm 224. Located immediately beneath the support arm 224 is a central spur gear 234 positioned so that its pitch circle is parallel to the plane of rotation of the support arm 224 and concentric about its axis o rotation 228. The central gear 234 is locked to prevent rotation by means of a locking spur gear 236 which is rigidly secured to one terminal end of a support bracket 238. The other terminal end of the bracket 238 is attached to the bottom wall 28. An idler spur gear 240 having its pitch circle aligned parallel to and its teeth engaged with those of the central gear 234 is secured beneath the support arm 224 intermediate its terminal ends. The idler gear 240 is attached so as to be rotatable with respect to the support arm 224 about a pin 241 secured thereto. A workpiece arm shaft 242, passing through an aperture formed in the support arm 224 near its second terminal end 232, is secured thereto so as to be rotatable about an axis parallel to the axis of rotation 228. A workpiece arm drive gear 244 is rigidly secured to the terminal end of the workpiece arm shaft 242 projecting beneath the support arm 224. The workpiece arm drive gear 244 is positioned along the workpiece arm shaft 224 so that its teeth engage those of the idler gear 240 and its pitch circle is parallel to that of the central gear 234. A first terminal end 246 of a unitary workpiece arm 248 is rigidly secured to the terminal end of the workpiece arm shaft 242 projecting above the support arm 224. A second terminal end 250 of the workpiece arm 248, adapted to receive and retain a disk-shaped workpiece 252 such as a silicon wafer, is formed to have a planar, U-shaped supporting wall 254 above the circumference of which projects a circular, horseshoe-shaped rim 256. A beveled edge 258, formed on the inner surface of the horseshoe-shaped rim 256, urges the disk-shaped workpiece 252 toward the center of the rim 256. A piece of incompletely cured silicone rubber 260 is secured to the upper surface of the U-shaped supporting wall 254 on both sides of its open end and about its base in order to provide a cushioned, high-friction surface to engage the lower surface of the disk-shaped workpiece 252.

The disk-shaped workpiece 252 may be removed from the second terminal end 250 of the workpiece arm 248 by centering the workpiece 252 above a terminal end 264 of a lowered elevator shaft 266. The elevator shaft 266 is then extended so that the terminal end 264 passes through the opening in the U-shaped supporting wall 254 to contact the lower surface of the workpiece 252 about its center and then to raise it above the upper surface of the rim 256. With the disk-shaped workpiece 252 thus elevated, the open end of the U-shaped supporting wall 254 and the horseshoe-shaped rim 256 permits the workpiece arm 248 to be withdrawn into the isolation chamber 22 leaving the workpiece 252 resting on the terminal end 264 of the extended elevator shaft 266. In a similar fashion, the disk-shaped workpiece 252 may be retrieved from the terminal end 264 extended above the rim 256 by causing the second terminal end 250 of the workpiece arm 248 to pass around the elevator shaft 266. The elevator shaft 266 is then lowered until the terminal end 264 descends beneath the lower surface of the workpiece arm 248, thereby depositing the workpiece 252 within the rim 256 of the second terminal end 250.

In general, the motion which may be induced in the center of the workpiece 252 by rotating the support arm 224 about the axis 228 lies along continuous paths in a plane perpendicular to the axis 228. The workpiece transfer mechanism 222 of this invention may be adapted to move the center of the disk-shaped workpiece 252 along the linear path by establishing a two-to-one gear ratio between the central gear 234 and the workpiece arm drive gear 244 and by making the distance between the center of the disk-shaped workpiece 252 and the center of the workpiece arm shaft 242 equal to the distance between the center of the workpiece arm shaft 242 and the axis of rotation 228. Construction of an arm having such distances establishes an isosceles triangle having its equal sides lying respectively along the longitudinal axis of the arms 224 and 248 and having its base between the axis of rotation 228 and the center of the workpiece 252. It can be shown that the perpendicular bisector of the base of such an isosceles triangle passes through the vertex at which the two equal sides meet thereby dividing the triangle into two identical right triangles lying on either side thereof. Also, in an arm so constructed, an angular displacement of the support arm 224 about the axis 228 causes the idler gear 240 to induce an angular displacement in the workpiece arm drive gear 244 measured with respect to the longitudinal axis of the support arm 224 which is equal to twice the displacement of the support arm 242 about the axis 228. For an arm thus constructed, this double angular displacement divides equally on both sides of the perpendicular bisector of the isosceles triangle. Consequently, rotation of the support arm 224 does not induce rotation in the perpendicular bisector but only causes it to translate laterally perpendicular to the base of the isosceles triangle. Therefore, angular displacement of the workpiece support arm 224 must induce linear motion in the center of the workpiece 252 otherwise the perpendicular bisector of the isosceles triangle would rotate as well as translate.

In the preferred embodiment of this invention, rotary motion is induced into the support arm 224 by means of a rotary drive shaft 272 aligned parallel to and centered about the axis of rotation 228. One terminal end of the drive shaft 272 is rigidly secured to the first terminal end 230 of the support arm 224. The remainder of the rotary drive shaft 272 extends downward through the pedestal 226 and the bottom wall 28 to project beneath the lower surface thereof. A seal 274, secured to the lower surface of the bottom wall 28, surrounds the rotary drive shaft 272 to prevent leakage into or out of the isolation chamber 22.

Figure 5:
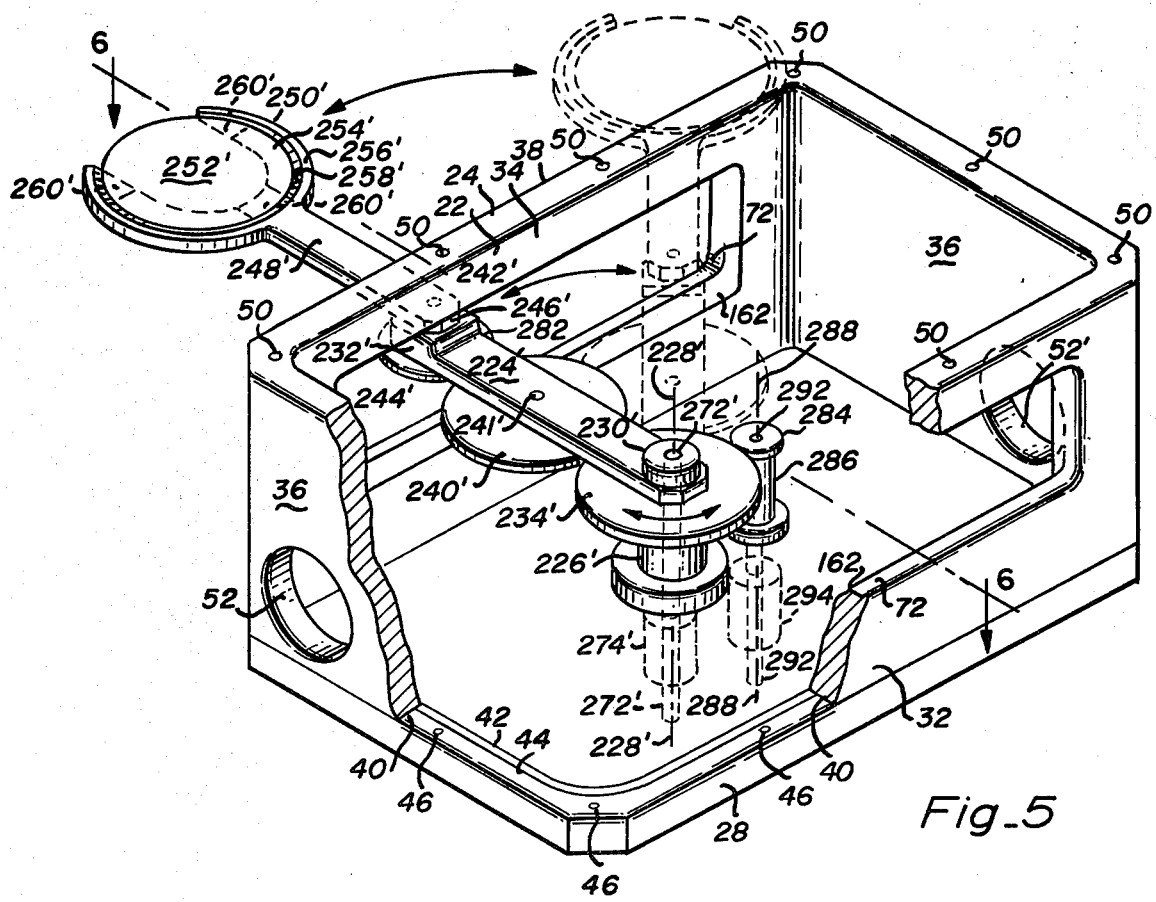
FIG. 5 is a partially sectioned perspective view of the loadlock of FIG. 1 showing arbitrary planar motion of the workpiece center.

FIG. 5 shows an alternative embodiment of the loadlock 20 of the present invention incorporating a wafer transfer mechanism referred to by the general reference number 282. Those elements common to the wafer transfer mechanism 222 carry the same reference numeral distinguished by a prime designation In this embodiment, the central gear 234' is secured so that it is rotatable about the axis 228' in a plane perpendicular thereto. In addition to being engaged by the idler gear 240', the central gear is engaged by an arm position control spur gear 284. The arm position control gear 284 is secured to the bottom wall 28 by means of a pedestal 286 so as to be rotatable about an axis 288 aligned parallel to the axis 228'. The central gear 234' of this alternative embodiment must have a thickness no less than the sum of the thicknesses of the idler gear 240' and the arm position control gear 284. The central gear 234' is positioned along the axis 228' so that its upper surface is coplanar with the upper surface of the idler gear 240'. The arm position control gear 284 is positioned along the axis 288 so that its lower surface is coplanar with the lower surface of the central gear 234'. With the gears 240', 234', and 284 disposed in these positions, the support arm 224' is free to rotate around the axis 228' with the idler gear 240' being able to pass above the arm position control gear 284.

If the arm position control gear 284 is locked, the wafer transfer mechanism 282 functions precisely the same as the wafer transfer mechanism 222. However, if the support arm 224' is held fixed while the arm position control gear 284 is rotated, this motion is coupled to the workpiece arm 248' causing it to rotate about the axis of rotation of the workpiece arm shaft 242' as shown in FIG. 6. Thus, by simultaneous motion of the support arm 224' and the arm position control gear 284, the center of the workpiece 252' may be moved to any point lying on or within a positioning circle centered about and perpendicular to the axis of rotation 228'. The radius of this positioning circle is equal to the distance between the center of the workpiece 252' and the axis of rotation of the workpiece arm shaft 242' plus the distance between the axis of rotation of the workpiece arm shaft 242' and the axis of rotation 228'. Furthermore, the center of the workpiece 252' may be moved between any two points lying on or within that circle along any arbitrarily chosen planar path lying within that circle.

As shown in FIG. 5, rotary motion is induced into the arm position control gear 284 in a manner analogous to that by which similar motion is induced into the support arm 225. Thus, an arm position rotary drive shaft 292, aligned parallel to and centered about the axis of rotation 288, is rigidly secured at one terminal end to the arm position control spur gear 284. The remainder of the arm position drive shaft 292 extends downward through the pedestal 286 and through the bottom wall 28 to project beneath the lower surface thereof. A seal 294, secured to the lower surface of the bottom wall 28, surrounds the arm position drive shaft 292 to prevent leakage into or out of the isolation chamber 22.

The loadlock 20 of this invention reduces the possibility of contaminating the workpiece 252 with any particles clinging to the moving parts of the loadlock 20 by having all of its component parts arranged so that the upper surface of the workpiece 252 passes beneath only the exposed surfaces of the top wall 26 and the side walls 32 and 34. The loadlock 20 avoids exposing the upper surface of the workpiece 252 to any other source of contamination even though both doors 74 may be closed and sealed while the isolation chamber 22 contains the workpiece 252. The loadlock 20 may be arranged in this closed and sealed state by rotating the support arm 224 of the workpiece transfer mechanism 222 so that its longitudinal axis becomes parallel to the longitudinal axis of the doors 74. Aligning the support arm 224 in this position causes the center of the workpiece 252 to be located on the axis of rotation 228 and hence centered between the side walls 32 and 34. It is readily apparent that the workpiece 252 can be similarly positioned by the workpiece transfer mechanism 282 by rotating both the support arm 224' and the arm positioned control gear 284. With the workpiece 252 disposed in this position, the space above the lowered open door 74 is unoccupied and hence it may be rotated upward and then translated into its closed and sealed position while the workpiece 252 remains within the chamber 22.

While the loadlock 20 of this invention has been described as adapted for operation with evacuated processing chambers, it may be readily adapted to operate with chambers containing other types of processing environments. Also, while the means for closing and sealing workpiece transfer apertures 72 has been described as adapted for sealing planar surfaces, that mechanism may be readily adapted to close and seal apertures formed in any surface all points of which are visible from a single point. Lastly, while the workpiece arm 248 has been described as adapted to transfer the disk-shaped workpiece 252, alteration of the shape of the second terminal end 250 thereof readily permits its adaptation to the transfer of other types of workpieces. However, incorporation of such a modified arm into the loadlock may necessitate alteration of the shape of other elements thereof which interact with the second terminal end 250 such as the shape of the workpiece transfer apertures 72 and consequently the doors 74.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

1. A loadlock comprising:

a sealable isolation chamber having walls through which is formed a first aperture for conducting fluids into or out of the chamber, said walls also having formed therethrough a plurality of workpiece transfer apertures for permitting the introduction of a workpiece into the isolation chamber and removal of a workpiece therefrom, said walls about said workpiece transfer aperture being adapted to mate with and to seal to an immediately adjoining wall such as may be part of a processing chamber;

closure means for individually closing and sealing said workpiece transfer apertures including a unitary door adapted to mate with and seal to a substantially planar surface such as may be part of a processing chamber to which the loadlock may be mated and sealed, the door having a substantially planar sealing surface which may be disposed into a workpiece transfer aperture in said walls of the isolation chamber so as to be adjacent to and substantially paralle to a planar surface of a processing chamber to which the loadlock is mated, and sealing surface having a continuous U-shaped trough adapted to receive and retain an O-ring formed therein, said trough being located near said periphery of said planar sealing surface, the door further including a pair of closure lugs projecting from a side of the door opposite to said sealing surface, said lugs being adapted to receive a rod-shaped door closure pin so as to dispose a longitudinal axis thereof substantially parallel to said sealing surface, said pair of lugs being further adapted to receive a first terminal end of a connecting link, the door including a control link projecting from said side of the door opposite to said sealing surface; and O-ring retained within said U-shaped trough of the door; a roller attached to said control link of the door adjacent to said terminal end of said control link farthest from said sealing surface, the roller being attached to be rotatable about an axis substantially parallel to said axis established for a longitudinal axis of a door closure pin by said closure lugs of the door; a track secured within the isolation chamber, the track being adapted to guide the roller to translate only in a direction essentially perpendicular to a planar surface of a processing chamber or sealing plate to which the door mates and seals whereby said axis about which the roller rotates is constrained to a plane of translation substantially perpendicular to a planar surface of a processing chamber or sealing plate to which the door mates and seals, the track being further adapted to restrain the door to be rotatable only about said axis of rotation of the roller attached to said control link of the door; a rod-shaped rotary drive shaft secured within the isolation chamber to be rotatable about an axis substantially parallel to said axis established for a longitudinal axis of a door closure pin by said closure lugs of the door, said axis about which the drive shaft is rotatable also being displaced to a side of said plane of translation of said axis about which the roller rotates; a pair of drive links secured to and projecting outward from the drive shaft, the links being adapted to receive and retain a rod-shaped drive pin to dispose said central longitudinal axis thereof at a distance from and parallel to said axis about which the drive shaft is rotatable, each pair of links being further adapted to receive a second terminal end of a connecting link; a connecting link having a first terminal end adapted to receive a rod-shaped door closure pin, said first terminal end of the link being engaged with said pair of said closure lugs of the door adapted to receive said first terminal end of the connecting link, a second terminal end of the connecting link being adapted to receive a rod-shaped drive pin, said second terminal end of the link being engaged with said terminal ends of the pair of drive links adapted to receive said second terminal end of the connecting link; a door closure pin passing through said pair of closure lugs of the door, said lugs being adapted to receive the door closure pin, the door closure pin also passing through said first terminal end of the connecting link engaged with said pair of closure lugs and adapted to receive the door closure pin; a drive pin passing through said terminal ends of a pair of drive links adapted to receive the drive pin, the drive pin also passing through said second terminal end of the connecting link engaged with the pair of drive links and adapted to receive the drive pin; a coil spring attached at a first terminal end to the door and having a second terminal end secured within the isolation chamber so as to urge the door to translate away from a planar surface of a processing chamber to which the door mates and seals; an L-shaped slide member secured to the door along said side surface thereof from which said closure lugs project and along an edge surface thereof located on an opposite side of the plane of translation of the roller from that on which the rod-shaped rotary drive shaft is located, the slide member being adapted for sliding engagement with a surface of said workpiece transfer aperture formed through said wall of the sealable isolation chamber whereby the door is restrained to translate only in a direction essentially perpendicular to a planar surface of a processing chamber to which the door mates and seals; and rotating drive means for rotating the drive shaft so that the door may be opened and closed, the rotary drive means being operable from outside the chamber;

workpiece transfer means for receiving a workpiece into the isolation chamber through a first open workpiece transfer aperture and for delivering a received workpiece from the isolation chamber through a second open workpiece transfer aperture;

the isolation chamber, the closure means and the workpiece transfer means being constructed such that all said workpiece transfer apertures may be simultaneously closed and sealed with a workpiece present within the isolation chamber whereby a workpiece may be sealed within the loadlock.

2. The loadlock as claimed in claim 1 wherein the rotating drive means includes a spur gear secured to the rotary drive shaft; a rack engaged with the gear secured to the rotary drive shaft to cause the drive shaft to rotate when the rack is translated longitudinally; an aperture formed in said wall of the isolation chamber, the aperture being adapted to receive a connecting rod of a pneumatic cylinder to permit said connecting rod to engage the rack; a pneumatic cylinder secured to the outside surface of said wall of the chamber, the cylinder having a connecting rod which passes through the aperture in said wall adapted to receive said connecting rod, said connecting rod also having its terminal end furthest from the pneumatic cylinder secured to a terminal end of the rack, the pneumatic cylinder and said connecting rod being disposed so that longitudinal translation of said connecting rod by actuation of the pneumatic cylinder through the application of pressurized gases thereto causes the rack to be urged to translate longitudinally whereby the drive shaft is urged to rotate, the pneumatic cylinder being further adapted to seal the aperture through said wall through which said connecting rod passes.

3. A loadlock comprising:

a sealable isolation chamber having walls through which is formed a first aperture for conducting fluids into or out of the chamber, said walls also having formed therethrough a plurality of workpiece transfer apertures for permitting the introduction of a workpiece into the isolation chamber and removal of a workpiece therefrom, said walls about said workpiece transfer aperture being adapted to mate with and to seal to an immediately adjoining wall such as may be part of a processing chamber;

closure means for individually closing and sealing said workpiece transfer apertures; and workpiece transfer means for receiving a workpiece into the isolation chamber through a first open workpiece transfer aperture and for delivering a received workpiece from the isolation chamber through a second open workpiece transfer aperture including a support arm secured within the isolation chamber to be rotatable about an axis located near a first terminal end thereof whereby a plane of rotation for the support arm is established; arm drive means for rotating the support arm about said axis located near said first terminal end thereof, the means being operable from outside the isolation chamber; a central gear disposed beneath and adjacent to the support arm to have said pitch circle thereof disposed substantially parallel to said plane of rotation for the support arm, said pitch circle also being substantially concentric with said axis about which the support arm is rotatable, the central gear further being fixed to be substantially immoveable with respect to the chamnber; an idler gear secured to the support arm on the same side thereof as the central gear to have said pitch circle of the idler gear disposed substantially parallel to said plane of rotation of the support arm, the idler gear also being secured to be rotatable with respect to the support arm about an axis disposed substantially parallel to said axis about which the support arm is rotatable, said teeth of said idler gear being engaged with said teeth of the central gear; a workpiece arm shaft secured to a second terminal end of the support arm to be rotatable with respect thereto about an axis substantially parallel to said axis about which the support arm is rotatable; a workpiece arm drive gear rigidly secured on the same side of the support arm as the central gear to a first terminal end of the workpiece arm shaft, the workpiece arm drive gear being disposed with its pitch circle substantially parallel to said plane of rotation of the support arm and substantially concentric with said longitudinal axis of the workpiece arm shaft, the workpiece arm drive gear being disposed with its teeth engaged with said teeth of the idler gear; a workpiece arm disposed on the opposite side of the support arm from the central gear and rigidly secured at a first terminal end thereof to a second terminal end of the workpiece arm shaft, a second terminal end of the workpiece arm being adapted to retain a workpiece; the distance between said axis about which the support arm is rotatable and said central longitudinal axis of the workpiece arm shaft, said diameters, locations, and ratios of the central gear and the workpiece arm drive gear, and the distance between said central longitudinal axis of the workpiece arm shaft and a workpiece retained at said second terminal end of the workpiece arm being such that the support arm may be rotated about said axis located near said first terminal end thereof to cause said second terminal end of the workpiece arm to move along a planar path passing sequentially through two separate open workpiece transfer apertures;

the isolation chamber, the closure means and the workpiece transfer means being constructed such that all said workpiece transfer apertures may be simultaneously closed and sealed with a workpiece present within the isolation chamber whereby a workpiece may be sealed within the loadlock.

4. The lodlock of claim 3 wherein the ratio between the workpiece arm drive gear and the central gear and the length of workpiece arm are selected such that a point within a workpiece may be translated along a linear path.

5. The loadlock of claim 3 wherein the ratio between the workpiece arm drive gear and the central gear is two-to-one and wherein said distance between said center of a workpiece retained at said second terminal end of the workpiece arm and said central longitudinal axis of the workpiece arm shaft equals said distance between said central longitudinal axis of the workpiece arm shaft and said axis about which the support arm is rotatable.

6. A loadlock comprising:

a sealable isolation chamber having walls through which is formed a first aperture for conducting fluids into or out of the chamber, said walls also having formed therethrough a plurality of workpiece transfer apertures for permitting the introduction of a workpiece into the isolation chamber and removal of a workpiece therefrom, said walls about said workpiece transfer aperture being adapted to mate with and to seal to an immediately adjoining wall such as may be part of a processing chamber;

closure means for individually closing and sealing said workpiece transfer apertures; and workpiece transfer means for receiving a workpiece into the isolation chamber through a first open workpiece transfer aperture and for delivering a received workpiece from the isolation chamber through a second open workpiece transfer aperture including a support arm secured within the isolation chamber so as to be rotatable about an axis located near a first terminal end thereof, whereby a plane of rotation for the support arm is established; arm drive means for rotating the support arm about said axis located near said first terminal end thereof, the means being operable from outside the isolation chamber; a central gear disposed beneath and adjacent to the support arm to have said pitch circle thereof disposed substantially parallel to said plane of rotation for the support arm, said pitch circle being substantially concentric with said axis about which the support arm is rotatable, the central gear further being rotatable about said axis about which the support arm is rotatable; arm position control means for rotating the central gear about said axis about which the support arm is rotatable, the means being operable from outside the isolation chamber; an idler gear secured to the support arm on the same side thereof as the central gear to have said pitch circle of the idler gear disposed substantially parallel to said plane of rotation of the support arm, the idler gear also being secured to be rotatable with respect to the support arm about an axis disposed substantially parallel to said axis about which the support arm is rotatable, said teeth of the idler gear engaged with said teeth of the central gear; a workpiece arm shaft secured to a second terminal end of the support arm to be rotatable with respect thereto about an axis substantially parallel to said axis about which the support arm is rotatable; a workpiece arm drive gear rigidly secured on the same side of the support arm as the central gear to a first terminal end of the workpiece arm shaft, the workpiece arm drive gear being disposed with its pitch circle substantially parallel to said plane of rotation of the support arm and substantially concentric with said longitudinal axis of the workpiece arm shaft, the workpiece arm drive gear being disposed with its teeth engaged with said teeth of the idler gear; a workpiece arm disposed on the opposite side of the support arm from the central gear and rigidly secured at a first terminal end thereof to a second terminal end of the workpiece arm shaft, a second terminal end of the workpiece arm being adapted to retain a workpiece; said distance between said axis about which the support arm is rotatable and said central longitudinal axis of the workpiece arm shaft and said distance between said central longitudinal axis of the workpiece arm shaft and the workpiece retained at said second terminal end of the workpiece arm being selected such that the support arm and central gear may be rotated about said axis located near said first terminal end of the support arm to cause said second terminal end of the workpiece arm to move sequentially along a path passing through two separate open workpiece transfer apertures;

the isolation chamber, the closure means and the workpiece transfer means being constructed such that all said workpiece transfer apertures may be simultaneously closed and sealed with a workpiece present within the isolation chamber whereby a workpiece may be sealed within the loadlock.

7. The loadlock of claim 6 wherein the arm position control means includes an aperture formed in said wall of the isolation chamber, the aperture being adapted to receive and retain an arm position drive shaft; an arm position drive shaft for transmitting rotary motion from outside the isolation chamber to within the isolation chamber, the arm position drive shaft being positioned within the aperture therefor formed in said isolation chamber wall and secured therein to be rotatable with respect thereto about an axis substantially parallel to said axis about which the support arm is rotatable; an arm position control gear disposed within the isolation chamber and rigidly secured to a first terminal end of the arm position drive shaft, said teeth of the arm position control gear being engaged with said teeth of the central gear; means for sealing between the rotary drive shaft and the aperture in said wall through which the rotary drive shaft extends.

8. The loadlock of claims 3 or 6 wherein the arm drive means for rotating the support arm about said axis located near said first terminal end thereof from outside the isolation chamber includes an aperture formed in said wall of the isolation chamber, the aperture being adapted to receive and retain a rotary drive shaft; a rotary drive shaft for transmitting rotary motion from outside the isolation chamber to within the isolation chamber, the rotary drive shaft being rigidly secured at one terminal end to the support arm and projecting therefrom through the aperture therefor formed in said isolation chamber wall, the rotary drive shaft being secured within the aperture therefor to be rotatable with respect thereto about said axis about which the support arm is rotatable; means for sealing between the rotary drive shaft and the aperture in said wall through which the rotary drive shaft extends.

9. The loadlock of claims 3 or 6 wherein said second terminal end of the workpiece arm adapted to retain a disk-shaped workpiece includes a substantially planar, U-shaped suporting wall around said outside periphery of which is formed a raised horseshoe-shaped retaining wall having a substantially circular-shaped inner side surface projecting upward above and beveled outward from the supporting wall.

10. The loadlock of claim 9 wherein said second terminal end of the workpiece arm adapted to retain a disk-shaped workpiece further includes means secured thereto for providing a cushioned, high friction surface for receiving a workpiece thereon.

* * * * *